(12) United States Patent
Hsuan et al.

(10) Patent No.: US 7,141,875 B2
(45) Date of Patent: Nov. 28, 2006

(54) FLEXIBLE MULTI-CHIP MODULE AND METHOD OF MAKING THE SAME

(75) Inventors: Min Chih Hsuan, Hsinchu (TW); Chi Shen Ho, Fremont, CA (US); Chang-Ming Lin, San Jose, CA (US); Kuolung Lei, San Jose, CA (US)

(73) Assignee: Aptos Corp, Milpitas, CA (US)

( * ) Notice: Subject to any disclaimer, the term of this patent is extended or adjusted under 35 U.S.C. 154(b) by 173 days.

(21) Appl. No.: 10/815,496

(22) Filed: Mar. 31, 2004

(65) Prior Publication Data

US 2005/0227412 A1    Oct. 13, 2005

(51) Int. Cl.
- H01L 23/34 (2006.01)
- H01L 21/44 (2006.01)
- H01L 21/48 (2006.01)
- H01L 21/50 (2006.01)

(52) U.S. Cl. .............. 257/723; 438/107; 438/108; 257/E23.177; 257/E23.179

(58) Field of Classification Search .......... 438/107, 438/108; 257/723, E23.177, E23.179
See application file for complete search history.

(56) References Cited

U.S. PATENT DOCUMENTS

| | | | |
|---|---|---|---|
| 5,646,446 A * | 7/1997 | Nicewarner et al. | 257/723 |
| 6,808,955 B1 * | 10/2004 | Ma | 438/51 |
| 2001/0006252 A1 * | 7/2001 | Kim et al. | 257/688 |
| 2001/0008306 A1 * | 7/2001 | Kamei et al. | 257/723 |
| 2002/0044423 A1 * | 4/2002 | Primavera et al. | 361/704 |
| 2002/0090756 A1 * | 7/2002 | Tago et al. | 438/108 |
| 2002/0127773 A1 * | 9/2002 | Shibata et al. | 438/108 |
| 2004/0089880 A1 * | 5/2004 | D'Amato et al. | 257/200 |

* cited by examiner

*Primary Examiner*—Carl Whitehead, Jr.
*Assistant Examiner*—Heather A. Doty
(74) *Attorney, Agent, or Firm*—Tung & Associates

(57) ABSTRACT

A semiconductor package including a flexible multichip module having multiple chips on flexible appendages with the flexible appendages folded so that the semiconductor chips are arranged in aligned and stacked positions.

59 Claims, 5 Drawing Sheets

FLEXIBLE MULTI-CHIP MODULE AND METHOD OF MAKING THE SAME

FIELD OF THE INVENTION

This invention relates to semiconductor packages, and more particularly to semiconductor packages involving flexible multi-chip modules and methods of making the same.

BACKGROUND OF INVENTION

A variety of semiconductor packages are known to those skilled in the art. Kondo, U.S. Pat. No. 6,469,903 states that it discloses a semiconductor device, including the flexible printed circuit having a first area part located in the center thereof, a second area part is provided continuous thereto, a third area part is provided continuous to the first part, and a wiring pattern formed on the surface of the above-described flexible circuit. A semiconductor element is mounted on a surface of the second part, and a second semiconductor element mounted on a surface of the third part. The second part is folded to a face side of a center part and a third part is folded to a rear side of the second part. However, Kondo teaches using a spacer in between chips that prevent the chips from engaging each other to provide group-packaging alignment. Therefore, in that disclosure, the physical implementation of packaging three chips requires three separate spacers, and each spacer require a bottom and top spot glassy epoxy to stick together.

Tesser, et al., U.S. Pat. No. 5,789,815 state that it discloses a three-dimensional package having a footprint size reduced by an approximate factor of four when compared to conventional electronic packaging. The module disclosed has a protective covering, such as a cap or sealant, as a moisture barrier. Thus, high integration using flexible appendages attach to a rigid substrate and singularly folded above the substrate results in both a small footprint package and also a light package. A reel-to-reel flexible tape assembly provides pretested flex boards resulting in cost effective manufacturable package for semiconductor components. The disclosure teaches placing a microprocessor on the rigid substrate portion and semiconductor die on a flexible appendage, and the flexible appendage is folded over so that the semiconductor die overlap the microprocessor.

Nakatsuka, U.S. Pat. No. 6,208,521 discloses a semiconductor package having a central base portion with a semiconductor element mounted on the base portion and four flexible appendages extending from the base portion. Semiconductor elements are also attached on each of the flexible appendages and the flexible appendages are folded over so that they overlie the semiconductor element on the central base portion. An adhesive layer is provided to insulate the semiconductor element on the central base portion from the semiconductor element attached to one of the flexible appendages.

SUMMARY OF THE INVENTION

One embodiment of the invention includes a method of making a semiconductor package comprising: providing a semiconductor carrier comprising at least a first flexible appendage connected to the body portion; each flexible appendage having a top face and a bottom face; and the body portion having the top face and a bottom face, a first semiconductor device and a second semiconductor device, each having a front face and a back face, the first semiconductor device and the second semiconductor device connected to the first flexible appendage with the front face of each semiconductor device facing the top face of the first flexible appendage, and forming a first fold in the first flexible appendage so that the back face of the first semiconductor device overlies the back face of the second semiconductor device.

Another embodiment of the invention includes a semiconductor package comprising a semiconductor carrier comprising at least a first flexible appendage connected to the body portion; each flexible appendage having a top face and a bottom face; and the body portion having the top face and a bottom face; a first semiconductor device and a second semiconductor device, each having a front face and a back face; the first semiconductor device and the second semiconductor device connected to the first flexible appendage with the front face of each semiconductor device facing the top face of the first flexible appendage and the first flexible appendage having a first fold therein so that the back face of the first semiconductor device overlies the back face of the second semiconductor device.

These and other embodiments of the present invention will become apparent from the following brief description of the drawings, detailed description of preferred embodiments and appended claims and drawings.

DETAILED DESCRIPTION OF PREFERRED EMBODIMENTS

Figure 1:
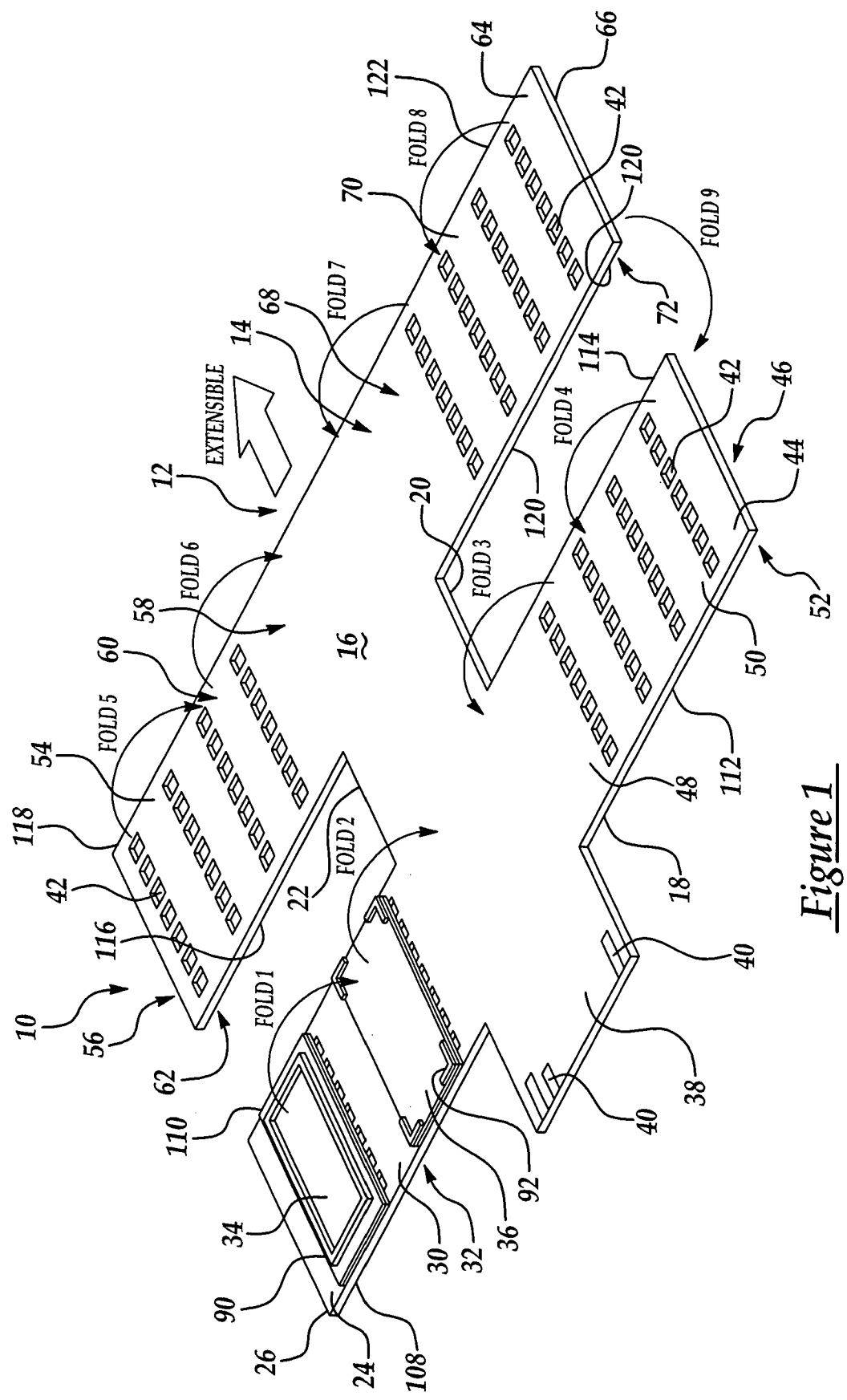
FIG. 1 is a prospective view of a flexible multichip module according to one embodiment of the present invention.

FIG. 1 illustrates one embodiment of a flexible multichip module according to the present invention in a laid open, unfolded position. The semiconductor package 10 includes a semiconductor device carrier 12, having a body portion 14. In one embodiment the carrier 12 comprises an anisotropic film having conductive particles that can be pressed and squeezed between a bump and wiring pattern by heating and pressing a semiconductor element and the film so that the bump and the wiring pattern are electrically connected. In another embodiment a wiring pattern may be provided in the carrier 12 exposed bond pads for making electrical connection to the carrier 12 in ways known to persons skilled in the art. In one embodiment, the body portion 14 is preferably flexible, made from a flexible material such as, but not limited to, a polyamide or other flexible circuit carrier known to those skilled in the art. The body portion 14 may also be rigid or semi-rigid made from a fiberboard base material, ceramic base material, plastic or other similar material. The body portion 14 includes a top face 16 and an opposite bottom face 18. The body portion 14 may include a first side 20 and an oppositely positioned second side 22 which in a preferred embodiment is parallel to the first side 20. The semiconductor package 10 includes a first flexible appendage 24, extending outwardly from the body portion 14. The first flexible appendage 24 includes a free end 26 and a second end 28 attached to the body portion 14. The first flexible appendage 24 includes a top face 30 and a oppositely positioned bottom face 32. The first flexible appendage 24 may include a first side 108 and an opposite second side 110. A first semiconductor device 34 is positioned on the first flexible appendage preferably near the free end 26. A second semiconductor device 36 is also positioned on the first flexible appendage 24 at a location nearer to the second end 28 of the flexible appendage.

The semiconductor package 10 may include an electrical connector 38 which, in one embodiment of the invention, extends from the body portion 14. The electrical connector 38 may include electrical leads or bond pads 40 thereon, so that the semiconductor package 10 may be electrically connected to external sources or devices.

In one embodiment, a second flexible appendage 44 may be provided and may extend from the body portion 14. The second flexible appendage may extend from the same side of the body portion or from an opposite side of the body portion 14. The second flexible appendage 44 includes a free end 46 and a second end 48 connected to the body portion 14. The second flexible appendage 44 includes a top face 50 and an opposite bottom face 52. The second flexible appendage 44 may include a first side 112 and a opposite second side 114. Bond pads 42 may be provided on all of the flexible appendages to which semiconductor devices may be attached (as shown in FIG. 1).

In one embodiment, a third flexible appendage may be provided and extends from the body portion 14. In a preferred embodiment, the third flexible appendage extends from the same side of the body portion as does the first flexible appendage 24. The third flexible appendage 54 includes a free end 56 and a second end 58 attached to the body portion 14. The third flexible appendage 54 includes a top face 60 and an opposite bottom face 62, and a first side 116 and an opposite second side 118. Preferably, a first slot 86 is defined between the first flexible appendage 24 and the third flexible appendage 54.

In another embodiment, a fourth flexible appendage 64 may be provided, having a free end 66 and a second end 68 connected to the body portion 14. The fourth flexible appendage 64 includes a top face 70 and an opposite bottom face 72, and a first side 120 and an opposite second side 122. Preferably, a second slot 88 is provided between the second flexible appendage 44 and the fourth flexible appendage 64. Although the semiconductor package 10 shown in FIG. 1 includes four flexible appendages, it will be appreciated that the semiconductor package may include numerous other flexible appendages by extending the body portion 14 in the direction of Arrow A and attaching a plurality of additional flexible appendages.

Figure 2:
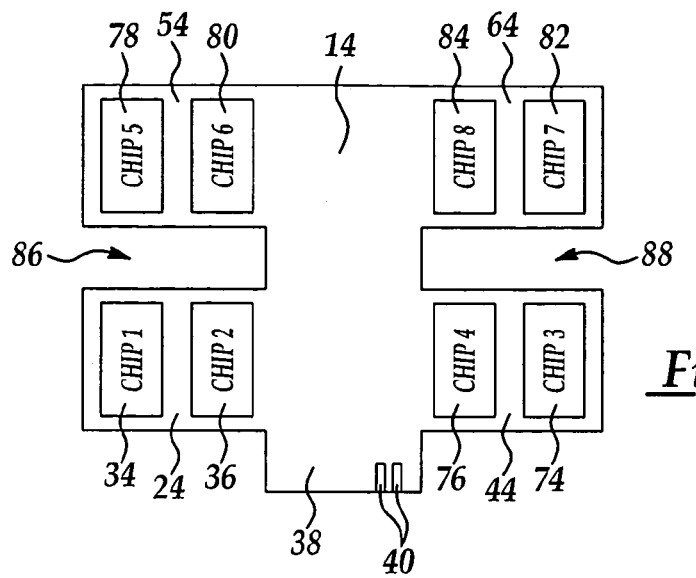
FIG. 2 is a prospective view of another embodiment of a flexible multichip module according to one embodiment of the present invention.

Referring now to FIG. 2, it will be appreciated that a flexible multichip module, according to the present invention, may include a plurality of flexible appendages 24, 44, 54, 64 with several semiconductor chips attached to each flexible appendage. As shown in FIG. 2, a first chip 34 and a second semiconductor chip 36 is attached to the first flexible appendage 24, and a third semiconductor chip 74 and a fourth semiconductor chip 76 is attached to the second flexible appendage 44. Similarly, a fifth semiconductor chip 78 and a sixth semiconductor chip 80 is attached to the third flexible appendage 54 and a semiconductor chip 82 and an eighth semiconductor chip 84 is attached to the fourth flexible appendage 64. Again, a slot 86 is defined between the first flexible appendage 24 and the third flexible appendage 54, and a slot 88 is defined between the second flexible appendage 44 and the fourth flexible appendage 64.

Figure 3:
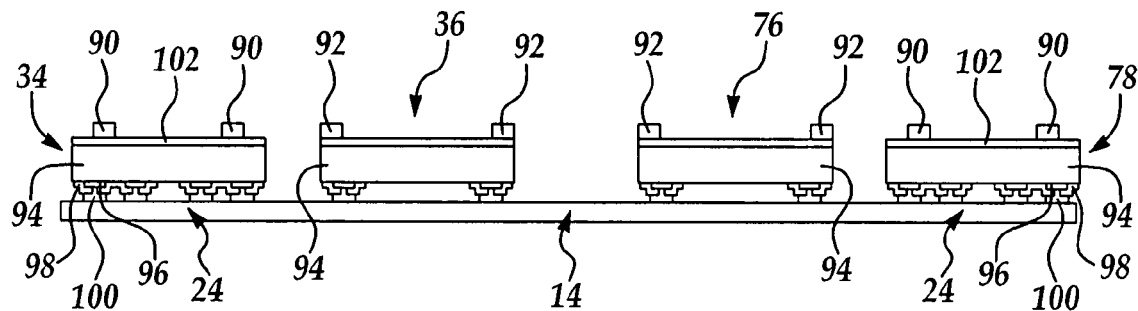
FIG. 3 is an enlarged, sectional, partial view of a portion of a flexible multichip module according to one embodiment of the present invention.

Referring now to FIG. 3, in one embodiment, a first passive alignment key 90 is provided on one of the two chips on the same flexible appendage, and a second passive alignment key 92 on the other chip. Each chip may include a semiconductor substrate 94, having bond pads 96 formed therein or thereon, and a first passivation layer 98 overlying the semiconductor substrate with openings formed therein exposing a portion of bond pads 96. An electrically conductive bump 100 may be bonded to the bond pad 96. An electrical insulation layer 102 may optionally be formed over the backside of the semiconductor substrate 94. One of the semiconductor chips 34 includes the first passive alignment key 90 formed therein or thereon (preferably over the electrical insulation layer 102), and in this case, the key 90 is spaced a distance from the outer edge of the semiconductor substrate 94. The other semiconductor substrate 36 includes the second passive alignment key 92 formed over the backside of the semiconductor substrate 94 and preferably on the electrical insulation layer 102. The second passive alignment key 92, in this case, is positioned near the outer edge of the semiconductor substrate 94. As will be appreciated as from FIG. 1, in one embodiment, the first passive alignment key 90 is spaced a distance from the outer edge of the semiconductor chip, and in the embodiment shown in FIG. 1, has a rectangular ring like shape. The second passive alignment key 92 is formed on the adjacent second chip 36 at a position near the outer edge of the semiconductor substrate, and in the embodiment shown in FIG. 1, preferably has an "L" shape so that the first passive alignment key 90 may be mated with the second passive alignment key 92 to properly position the first semiconductor chip 34 over the second semiconductor chip 36 and so that the back face of each engage each other.

Figure 4A:
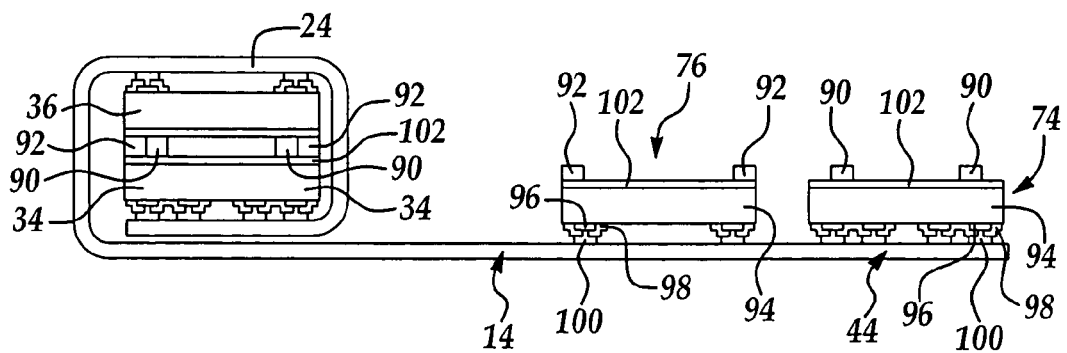
FIG. 4A illustrates an act in a method of making a flexible multichip module according to one embodiment of the present invention.
Figure 4B:
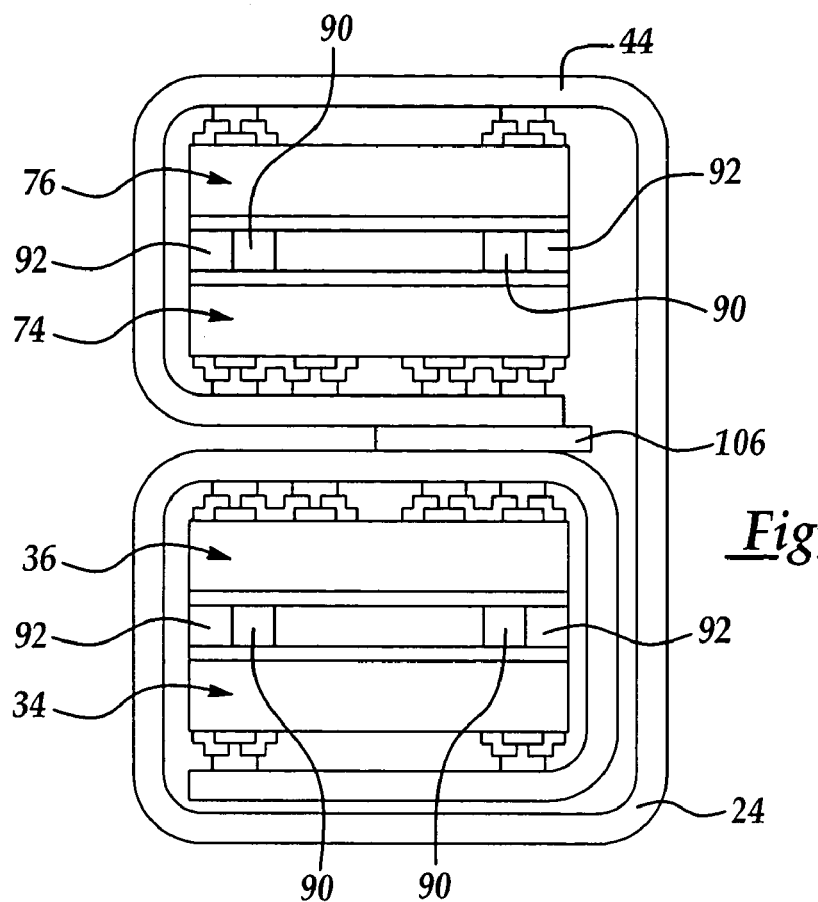
FIG. 4B illustrates an act in a method of making a flexible multichip module according to one embodiment of the present invention.
Figure 4C:
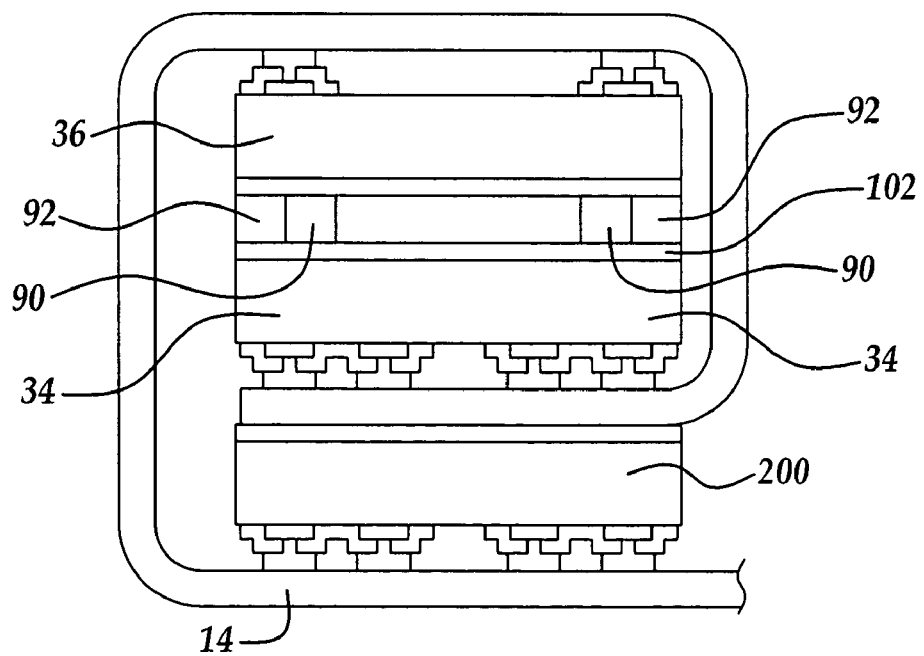
FIG. 4C illustrates an alternative act in a method of making a flexible multichip module according to one embodiment of the invention.

Referring again to FIG. 1, a method of making a flexible multichip method according to the present invention includes forming a first fold, in the direction of the arrow labeled "Fold 1," in the first flexible appendage 24 so that the first semiconductor chip 34 overlies the second semiconductor chip 36. The alignment of the first semiconductor chip 34 to the second semiconductor chip 36 is aided by the first passive alignment key feature 90 on the first semiconductor chip 34 mating with the second passive alignment key 92 on the second semiconductor chip 36. Thereafter, the first flexible appendage 24 is folded again as shown by the arrow labeled "Fold 2" so that the bottom face 32 of the first flexible appendage 24 overlies, and preferably, engages the top face 16 of the body portion 14 as best shown in FIG. 4a. In this arrangement, both the first semiconductor device 34 and the second semiconductor device 36 on the first flexible appendage 24, overlie the body portion 14. In another embodiment shown in FIG. 4C, a semiconductor 200 may be secured to the body portion 14 and the first flexible appendage 24 is folded so the first and second semiconductor devices 34 and 36 overlie the semiconductor 200 on the body portion 14.

Referring again to FIG. 1, the second flexible appendage 44 may be folded a first time as shown by fold arrow labeled "Fold 3" so that the third semiconductor chip 74 overlies and engages the fourth semiconductor chip 76 using the alignment keys 90, 92 on both chips. The second flexible appendage 44 is folded a second time as illustrated by the arrow labeled "Fold 4" so that a portion of the bottom face 52 of the second flexible appendage 44 overlies, and preferably, engages a portion of the bottom face 18 of the first flexible appendage 24 so that the third semiconductor chip 74 overlies and is nearest the second semiconductor chip 36 on the first flexible appendage 24, as will be best seen from FIG. 4b.

The third flexible appendage 54 may be folded in the manner similar to the first flexible appendage 24 so that a first fold is formed in a manner illustrated by the arrow labeled "Fold 5" so that the fifth semiconductor chip 78 overlies and is aligned preferably by the keys 90, 92 with semiconductor chip 68 on the third flexible appendage 54. The third flexible appendage 54 is then folded a second time as illustrated by the arrow labeled "Fold 6" so that the bottom face 62 of the third flexible appendage 54 overlies and engages a portion of the top surface 16 of the body portion 14. In this arrangement, the fifth semiconductor chip 78 is nearest the body portion 14.

The fourth flexible appendage 64 may be folded in a manner similar to the second flexible appendage 44 including folding the fourth flexible appendage 64 a first time as illustrated by the arrow labeled "Fold 7" so that the seventh semiconductor chip 82 is overlying, aligned and engaged with the eight semiconductor chip 84 on the fourth flexible appendage 64. The fourth flexible appendage 64 is then folded a second time as illustrated by the arrow labeled "Fold 8" so that a portion of the bottom face 72 of the fourth flexible appendage 64 overlies and engages a portion of the bottom face 62 of the third flexible appendage 54. In this arrangement, the seventh semiconductor chip 82 overlies and is nearest the sixth semiconductor chip 80 on the third flexible appendage 54. Alternatively, an adhesive layer 106 may be interposed between folded sections of appendages as will be best appreciated by FIG. 4b.

Figure 5:
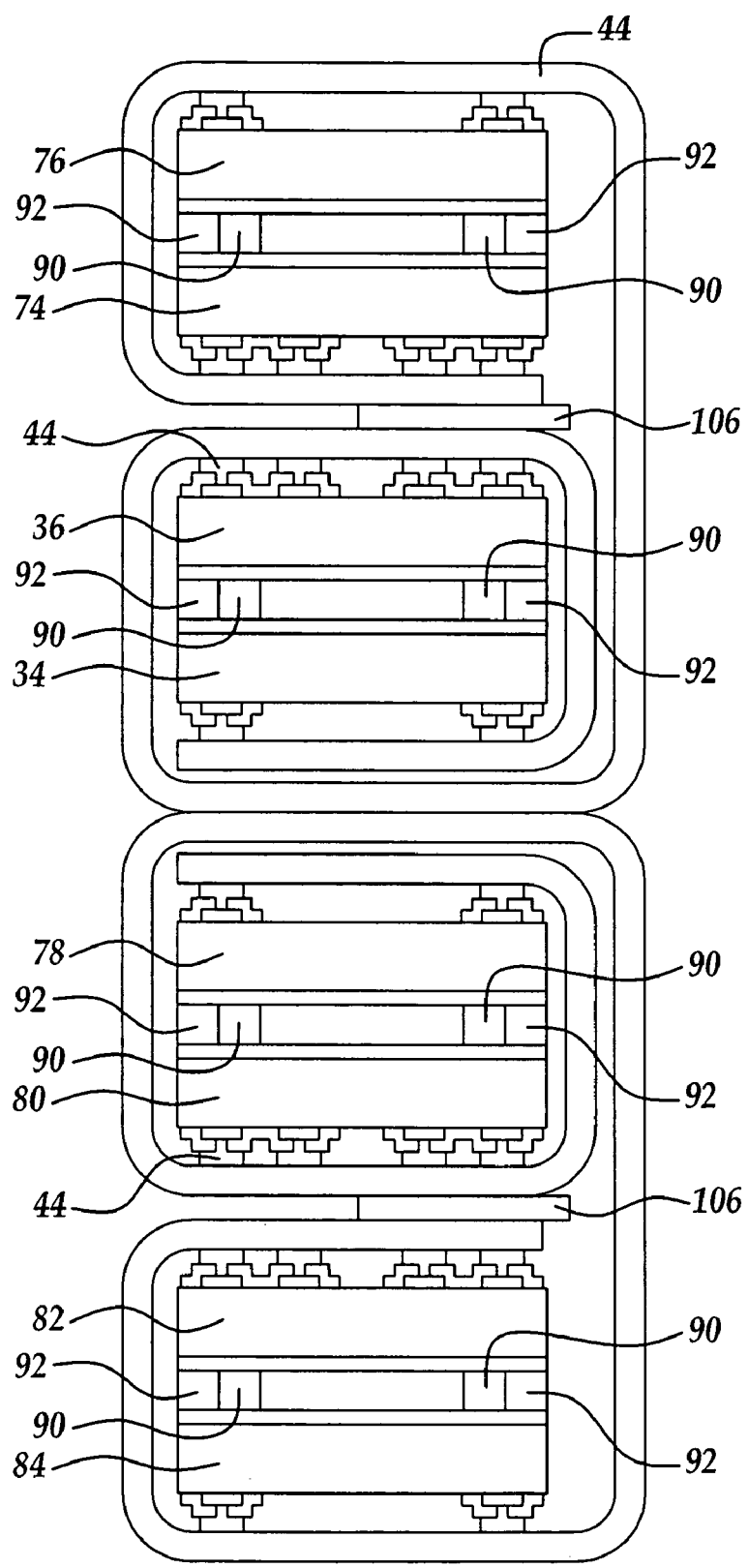
FIG. 5 illustrates a flexible multichip module according to one embodiment of the present invention, having eight chips.
Figure 6:
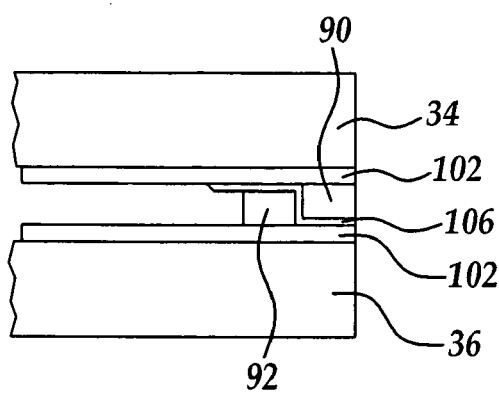
FIG. 6 is an enlarged, sectional view of a portion of a flexible multichip module illustrating alignment keys on semiconductor devices of the flexible multichip module according to one embodiment of the present invention.

In another embodiment of the invention, the body portion 14 may be folded in a direction as shown by arrow labeled "Fold 9" to form a semiconductor package with the eight semiconductor chips 34, 36, 74, 76, 78, 80, 82, 84 stacked on top of each other. A flexible multichip module with eight semiconductor chips stacked on top of each other according to the present invention is illustrated in FIG. 5.

Figure 7A:
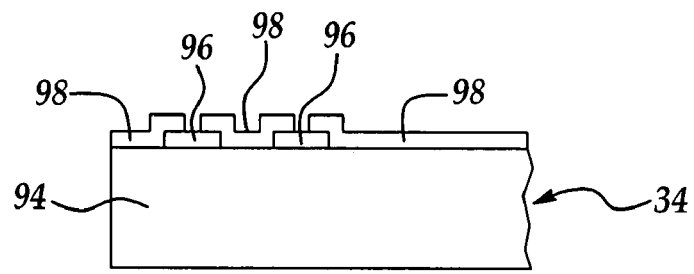
FIG. 7A illustrates an act in a method of making a semiconductor device useful in making a flexible multichip module according to one embodiment of the present invention.
Figure 7B:
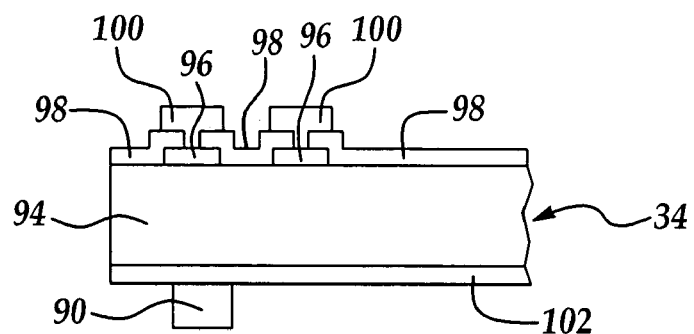
FIG. 7B illustrates an act in a method of making a semiconductor device, having a key alignment feature thereon, useful in making a flexible multichip module according to one embodiment of the present invention.
Figure 7C:
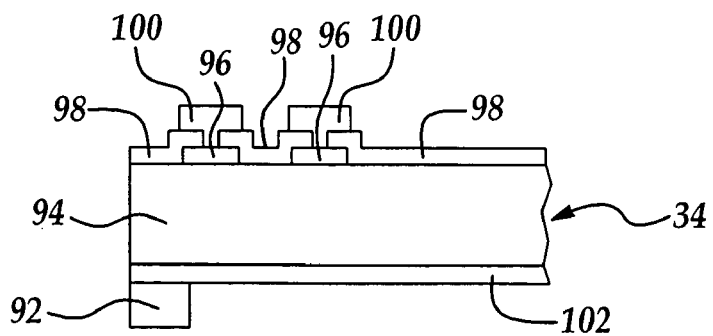
FIG. 7C illustrates an act in a method of making a semiconductor device with a second key alignment feature for making a flexible multichip module according to one embodiment of the present invention.

Referring now to FIG. 7a, a semiconductor package according to the present invention may be made by providing a first semiconductor device 34, including a substrate portion 94 and bond pads 96 formed thereon or therein, and a first passivation layer 96 formed over the substrate portion and having openings formed therein each exposing a portion of a bond pad 96. An electrical insulation layer 102 may be deposited on the back face of the substrate portion, and a first passive alignment key 90 may be formed on the semiconductor device 34 directly on the substrate portion 94 or over the electrical insulation layer 102 (if present), as shown in FIG. 7b. A second semiconductor device 36 may be provided, also having a substrate portion 94, bond pads 96 formed thereon or therein, a first passivation layer over the substrate portion having openings therein, each exposing a portion of a bond pad 96. Optionally, the second semiconductor device 36 may include an electrical insulation layer 102 overlying the backside of the substrate portion 94. A second alignment key 92 may be formed directly on the substrate portion 94, or on the electrically insulation layer 102 if present. In a preferred embodiment, the first passive alignment key 90 and the second passive alignment key 92 have configurations as illustrated in FIG. 1.

What is claimed is:

1. A method of making a semiconductor package comprising:

providing a semiconductor carrier comprising at least a first flexible appendage connected to a body portion; each flexible appendage having a top face and a bottom face; and the body portion having a top face and a bottom face, a first semiconductor device and a second semiconductor device, each having a front face and a back face, the first semiconductor device and the second semiconductor device connected to the first flexible appendage with the front face of each semiconductor device facing the top face of the first flexible appendage, the first semiconductor device further comprises a first alignment key and the second semiconductor device further comprises a second alignment key mateable with the first alignment key, wherein the first alignment key comprises a raised feature spaced a distance from a side edge of the first semiconductor device, wherein the second alignment key comprises a raised feature spaced a distance from a side edge of the second semiconductor device and wherein a second distance is shorter than a first distance, and forming a first fold in the first flexible appendage so that the back face of the first semiconductor device overlies the back face of the second semiconductor device.

2. A method of making a semiconductor package as set forth in claim 1 further comprising a forming a second fold so in the first flexible appendage that a portion of the bottom face of the first flexible appendage underlying the first semiconductor device also overlies the top face of the body portion.

3. A method of making a semiconductor package as set forth in claim 2 further comprising bonding a semiconductor device to the body portion prior to forming the second fold, and wherein the first semiconductor device overlies the semiconductor device bonded to the body portion.

4. A method of making a semiconductor package as set forth in claim 1, wherein there is no semiconductor device bonded to the body portion.

5. A method of making a semiconductor package as set forth in claim 1 further comprising forming at least one of the first alignment key and the second alignment key by depositing a raised feature on the back face of an associated semiconductor device.

6. A method of making a semiconductor package as set forth in claim 1 further comprising forming both of the first alignment key and the second alignment key by depositing an associated raised feature on the back face of one of the first semiconductor device and second semiconductor device.

7. A method of making a semiconductor package as set forth in claim 1 wherein the first alignment key comprises a raised feature positioned near a side edge of the first semiconductor device.

8. A method of making a semiconductor package as set forth in claim 7 wherein the second alignment key comprises a raised feature spaced a distance from a side edge of the second semiconductor device.

9. A method of making a semiconductor package as set forth in claim 1 further comprising bonding the first semiconductor device to the second semiconductor device with an adhesive.

10. A method of making a semiconductor package as set forth in claim 1 further comprising depositing an electric insulation layer on each of the first and second semiconductor device and thereafter forming the first alignment key on one of the first and second semiconductor device and forming the second alignment key on the other of the first and second semiconducter device.

11. A method of making a semiconductor package as set forth in claim 10 wherein the forming of each of the first and second alignment key comprises depositing a material comprising copper.

12. A method of making a semiconductor package as set forth in claim 10 wherein at least one of the first and second alignment key comprises a bump having a ring shape.

13. A method of making a semiconductor package as set forth in claim 12 wherein at least one of the first and second alignment key comprises a bump having an "L" shape.

14. A method of making a semiconductor package as set forth in claim 1 wherein at least one of the first and second semiconductor device further comprises an electrically conductive bump connecting the semiconductor device to the first flexible appendage.

15. A method of making a semiconductor package as set forth in claim 1 wherein there is no spacer between the back face of the first semiconductor device and the back face of the second semiconductor device.

16. A method of making a semiconductor package as set forth in claim 1 further comprising an electrical connector extending from the body portion.

17. A method of making a semiconductor package as set forth in claim 1 wherein the body portion is flexible.

18. A method of making a semiconductor package as set forth in claim 1 wherein the body portion comprises at least one of a ceramic, a fiberglass based board, a plastic and a polyimide.

19. A method of making a semiconductor package as set forth in claim 1 wherein the carrier comprises a flexible circuit.

20. A method of making a semiconductor package as set forth in claim 1 wherein the carrier comprises a polyimide.

21. A method of making a semiconductor package as set forth in claim 1 wherein the carrier comprises an anisotropic conductive film.

22. A method of making a semiconductor package as set forth in claim 1 wherein at least one of the first and second semiconductor device comprises a micro-electromechanical device.

23. A method of making a semiconductor package as set forth in claim 1 wherein the second flexible appendage extends from the opposite side of the body portion.

24. A method of making a semiconductor package as set forth in claim 1 wherein the second flexible appendage extends from the same side of the body portion as the first flexible appendage.

25. A method of making a semiconductor package as set forth in claim 24 wherein the first flexible appendage and the second flexible appendage define a slot therebetween.

26. A method of making a semiconductor package as set forth in claim 1 wherein the package further comprises a second flexible appendage extending from the body portion and further comprising a third semiconductor device and a fourth semiconductor device each connected to the second flexible appendage, the third semiconductor device and the fourth semiconductor device each having a front face and a back face, and wherein the second flexible appendage includes a top face and a bottom face, and wherein the third semiconductor device and the second semiconductor device are connected to the second flexible appendage with the front face of each of the third and fourth semiconductor device facing the top face of the second flexible appendage, forming a first fold in the second flexible appendage so that the back face of the third semiconductor device overlies the back face of the fourth semiconductor device.

27. A method of making a semiconductor package as set forth in claim 26 further comprising forming a second fold in the second flexible appendage so that the bottom face of the second flexible appendage overlies a portion of the bottom face of the first flexible appendage and so that the first, second, third and fourth semiconductor devices are stacked in overlying and aligned positions.

28. A method of making a semiconductor package as set forth in claim 27 wherein the package further comprises a third flexible appendage extending from the body portion and further comprising a fifth semiconductor device and a sixth semiconductor device each connected to the third flexible appendage, the fifth semiconductor device and the six semiconductor device each having a front face and a back face, and wherein the third flexible appendage includes a top face and a bottom face, and wherein the fifth semiconductor device and the sixth semiconductor device are connected to the third flexible appendage with the front face of each of the fifth and sixth semiconductor device facing the top face of the third flexible appendage, forming a first fold in the third flexible appendage so that the back face of the fifth semiconductor device overlies the back face of the sixth semiconductor device.

29. A method of making a semiconductor package as set forth in claim 28 further comprising forming a second fold in the third flexible appendage so that the bottom face of the third flexible appendage overlies a portion of the top face of the body.

30. A method of making a semiconductor package as set forth in claim 29 wherein the package further comprises a fourth flexible appendage extending from the body portion and further comprising a seventh semiconductor device and a eighth semiconductor device each connected to the fourth flexible appendage, the seventh semiconductor device and the eighth semiconductor device each having a front face and a back face, and wherein the fourth flexible appendage includes a top face and a bottom face, and wherein the seventh semiconductor device and the eight semiconductor device are connected to the fourth flexible appendage with the front face of each of the seventh and eighth semiconductor device facing the top face of the fourth flexible appendage, forming a first fold in the fourth flexible appendage so that the back face of the seven semiconductor device overlies the back face of the eighth semiconductor device.

31. A method of making a semiconductor package as set forth in claim 30 further comprising forming a second fold in the fourth flexible appendage so that the bottom face of the fourth flexible appendage overlies a portion of the bottom face of the third flexible appendage and so that the fifth, sixth, seventh and eighth semiconductor devices are stacked in overlying and aligned positions.

32. A method as set forth in claim 31 further comprising forming a fold in the boding portion so that the first, second, third, fourth, fifth, sixth, seventh and eighth semiconductor devices are in overlying and aligned positions.

33. A method as set forth in claim 1 further comprising forming a fold in the body portion.

34. A semiconductor package comprising a semiconductor carrier comprising at least a first flexible appendage connected to a body portion; each flexible appendage having a top face and a bottom face; and the body portion having the top face and a bottom face;

a first semiconductor device and a second semiconductor device, each having a front face and a back face;

the first semiconductor device and the second semiconductor device being connected to the first flexible appendage with the front face of each semiconductor device facing the top face of the first flexible appendage and the first flexible appendage having a first fold therein so that the back face of the first semiconductor device overlies the back face of the second semiconductor device and a second fold formed in the first flexible appendage so that a portion of the bottom face of the first flexible appendage underlying the first semiconductor device also overlies the top face of the body portion, the first semiconductor device further comprises a first alignment key and the second semiconductor device further comprises a second alignment key mateable with the first alignment key, wherein the first alignment key comprises a raised feature spaced a distance from a side edge of the first semiconductor device, wherein the second alignment key comprises a raised feature spaced a distance from a side edge of the second semiconductor device and wherein a second distance is shorter than a first distance.

35. A semiconductor package as set forth in claim 34 further comprising a semiconductor device bonded to the body portion and wherein the first semiconductor device overlies the semiconductor device bonded to the body portion.

36. A semiconductor package as set forth in claim 34 wherein there is no semiconductor device bonded to the body portion.

37. A semiconductor package as set forth in claim 34 wherein one of the first alignment key and the second alignment key comprises a raised feature.

38. A semiconductor package as set forth in claim 37 wherein each of the first and second alignment key comprise a raised feature.

39. A semiconductor package as set forth in claim 37 wherein the first alignment key comprises a raised feature positioned near a side edge of the first semiconductor device.

40. A semiconductor package as set forth in claim 39 wherein the second alignment key comprises a raised feature spaced a distance from a side edge of the second semiconductor device.

41. A semiconductor package as set forth in claim 34 further comprising an adhesive bonding the first semiconductor device to the second semiconductor device.

42. A semiconductor package as set forth in claim 37 wherein each of the first semiconductor and second semiconductor each further comprises an electric insulation layer.

43. A semiconductor package as set forth in claim 42 wherein each of the first and second alignment key comprises a bump comprising copper.

44. A semiconductor package as set forth in claim 42 wherein at least one of the first and second alignment key comprises a bump having a ring shape.

45. A semiconductor package as set forth in claim 44 wherein at least one of the first and second alignment key comprises a bump having a "L" shape.

46. A semiconductor package as set forth in claim 34 wherein at least one of the first and second semiconductor device further comprises an electrically conductive bump connecting the semiconductor device to the first flexible appendage.

47. A semiconductor package as set forth in claim 34 wherein there is no spacer between the back face of the first semiconductor device and the back face of the second semiconductor device.

48. A semiconductor package as set forth in claim 34 further comprising an electrical connector extending from the body portion.

49. A semiconductor package as set forth in claim 34 wherein the body portion is flexible.

50. A semiconductor package as set forth in claim 34 wherein the body portion comprises at least one of a ceramic, a fiberglass based board, a plastic and a polyimide.

51. A semiconductor package as set forth in claim 34 wherein the carrier comprises a flexible circuit.

52. A semiconductor package as set forth in claim 34 wherein the carrier comprises a polyimide.

53. A semiconductor package as set forth in claim 34 wherein the carrier comprises an anisotropic conductive film.

54. A semiconductor package as set forth in claim 34 wherein at least one of the first semiconductor and second semiconductor device comprises a micro electromechanical device.

55. A semiconductor package as set forth in claim 34 further comprising the second flexible appendage extending from the opposite side of the body portion.

56. A semiconductor package as set forth in claim 34 further comprising a second flexible appendage extending from the same side of the body portion as the first flexible appendage.

57. A semiconductor package as set forth in claim 56 wherein the first flexible appendage and the second flexible appendage define a slot therebetween.

58. A semiconductor package as set forth in claim 34 further comprising a second flexible appendage extending from the body portion and further comprising a third semiconductor device and a fourth semiconductor device, each connected to the second flexible appendage, the third semiconductor device and the fourth semiconductor device each having a front face and a back face, and wherein the second flexible appendage includes a top face and a bottom face, and wherein the third semiconductor device and the second semiconductor device are connected to the second flexible appendage with the front face of each semiconductor device facing the top face of the second flexible appendage and the second flexible appendage having a first fold therein so that the back face of the third semiconductor device overlies the back face of the fourth semiconductor device.

59. A semiconductor package as set forth in claim 58 wherein the second flexible appendage includes a second fold therein so that the bottom face of the second flexible appendage overlies a portion of the bottom face of the first flexible appendage and so that the first, second, third and fourth semiconductor devices are stacked in overlying and aligned positions.

* * * * *